United States Patent [19]

Yamaura et al.

[11] Patent Number: 5,511,173
[45] Date of Patent: Apr. 23, 1996

[54] PROGRAMMABLE LOGIC ARRAY AND DATA PROCESSING UNIT USING THE SAME

[75] Inventors: Shinichi Yamaura, Takarazuka; Takashi Yasui, Toyonaka; Keiichi Yoshioka, Sanda, all of Japan

[73] Assignee: Ricoh Co., Ltd., Tokyo, Japan

[21] Appl. No.: 177,794

[22] Filed: Jan. 5, 1994

Related U.S. Application Data

[63] Continuation of Ser. No. 608,202, Nov. 2, 1990, abandoned.

[30] Foreign Application Priority Data

Nov. 8, 1989 [JP] Japan ................................ 1-290667

[51] Int. Cl.$^6$ ........................................................ G06F 9/30
[52] U.S. Cl. ........................ 395/375; 326/44; 364/DIG. 1
[58] Field of Search ................................. 326/44, 45, 47, 326/39, 40, 41; 395/375

[56] References Cited

U.S. PATENT DOCUMENTS 4,713,750 12/1987 Damouny et al. ..................... 395/800
4,839,890 6/1989 Semerau et al. ........................ 370/84
4,947,369 8/1990 Thoma et al. ......................... 395/375
5,123,096 6/1992 Matuo ................................. 395/375

FOREIGN PATENT DOCUMENTS 60-145488 7/1985 Japan .

OTHER PUBLICATIONS

*Halbleiter–Schaltungstechnik*, U. Tietze & Ch. Schenk, 6th Edition 1983, pp. 273–278 (with partial translation).

*Primary Examiner*—William M. Treat
*Attorney, Agent, or Firm*—Cooper & Dunham

[57] ABSTRACT

A programmable logic array includes a plurality of AND planes. Each AND plane executes an AND logic operation and has input terminals and output terminals. The programmable logic array also includes a single OR plane provided in common for the plurality of AND planes. The single OR plane executes an OR logic operation and has input terminals coupled to the output terminals of the plurality of AND planes and output terminals. A data processing unit using the above programmable logic array is also provided.

24 Claims, 7 Drawing Sheets

[FORMAT 1] INSTRUCTION HAVING NO PREBYTE DATA

OPERATION CODE : 1 BYTE
OPERAND #1 : 0~4 BYTES

FIG.2A

[FORMAT 2] INSTRUCTION WITH PREBYTE DATA

PREBYTE : 1 BYTE
OPERATION CODE : 1 BYTE
OPERAND #1 : 0~5 BYTES

FIG.2B

[FORMAT 3] INSTRUCTION WITH PREBYTE DATA

PREBYTE : 1 BYTE
OPERATION CODE : 1 BYTE
OPERAND #2 : 1~3 BYTES
OPERAND #1 : 0~2 BYTES

PROGRAMMABLE LOGIC ARRAY AND DATA PROCESSING UNIT USING THE SAME

This is a continuation of application Ser. No. 07/608,202 filed Nov. 2, 1990, now abandoned.

BACKGROUND OF THE INVENTION

The present invention generally relates to a programable logic array and a data processing unit using the same, such as a central processing unit.

Conventionally, when a desired logic is implemented using a programmable logic array (hereafter simply referred to as a PLA), a multi-stage logic circuit is used to mimimize the number of product terms. Normally, a multi-stage logic circuit is a two-stage logic circuit consisting of an AND circuit and an OR circuit. An output signal of the OR circuit is fed back to the input side of the AND circuit. Alternatively, the multi-stage logic circuit can be a plurality of PLAs connected in serial and parallel forms. Particularly, in a case where an instruction or command is decoded by a central processing unit (hereafter simply referred to as a CPU), it is advantageous to use the above-mentioned multi-stage logic circuit which processes a complex instruction system or to use a single PLA having a large number of product terms.

However, when such a PLA having a large number of product terms is used, it is necessary to reduce the number of product terms. For this purpose, a logic convolution process is needed. A logic convolution process is directed to grouping input lines of the PLA into two product term lines interchanging with each other so that unnecessary input lines are removed. With the logic convolution process, it becomes possible to minimize the structure of the PLA.

As described above, the logic convolution process reduces the size of the PLA. However, when configuring a CPU having a PLA using the above-mentioned logic convolution process, it is also necessary to provide instruction registers which store instructions for executing the logic convolution process and provide a timing control circuit which generates timing signals used for sending the instructions stored in the instruction registers to the PLA. In this case, it is necessary to provide interconnection lines between the provided instruction registers and the timing control circuits. As a result, the entire CPU size increases although the PLA itself is minimized. Further, programming of the logic convolution process is very troublesome, and thus there is a need for a large amount of work. Moreover, it is very difficult to modify the programmed PLA logic, since the logic convolution process is very complex. Furthermore, the signals supplied to the AND circuit (plane) from the instruction registers and the timing control circuits have large loads, and there is a possibility that the decoding speeds of the instructions are different from each other. In addition, a large amount of delay time occurs until the decoded signals are obtained, particularly when the multi-stage logic circuit is employed.

SUMMARY OF THE INVENTION

It is a general object of the present invention to provide an improved programmable logic array in which the above-mentioned disadvantages are eliminated.

A more specific object of the present invention is to provide a programmable logic array which operates at high speed and which has a reduced size.

The above-mentioned objects of the present invention are achieved by a programmable logic array comprising:

a plurality of AND planes, each executing an AND logic operation and having input terminals and output terminals; and a single OR plane provided in common for the plurality of AND planes and executing an OR logic operation, the single OR plane having input terminals coupled to the output terminals of the plurality of AND planes.

Another object of the present invention is to provide a data processing unit using the above-mentioned programmable logic array.

This object of the present invention is achieved by a data processing unit comprising:

a PLA (programmable logic array) circuit which receives information supplied from an external device and outputs a decoded signal;

interface means, coupled to the PLA circuit, for generating a control signal from the decoded signal; and operation means, coupled to the interface means and having an arithmetic logic unit, for carrying out an operation on data on the basis of the control signal, wherein the PLA circuit comprises:

a plurality of AND planes, each executing an AND logic operation on the information and having input terminals and output terminals; and a single OR plane provided in common for the plurality of AND planes and executing an OR logic operation on signals output from the AND planes, the single OR plane having input terminals coupled to the output terminals of the plurality of AND planes, and output terminals through which the decoded signal is output.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of a central processing unit according to a preferred embodiment of the present invention.

Figure 1:
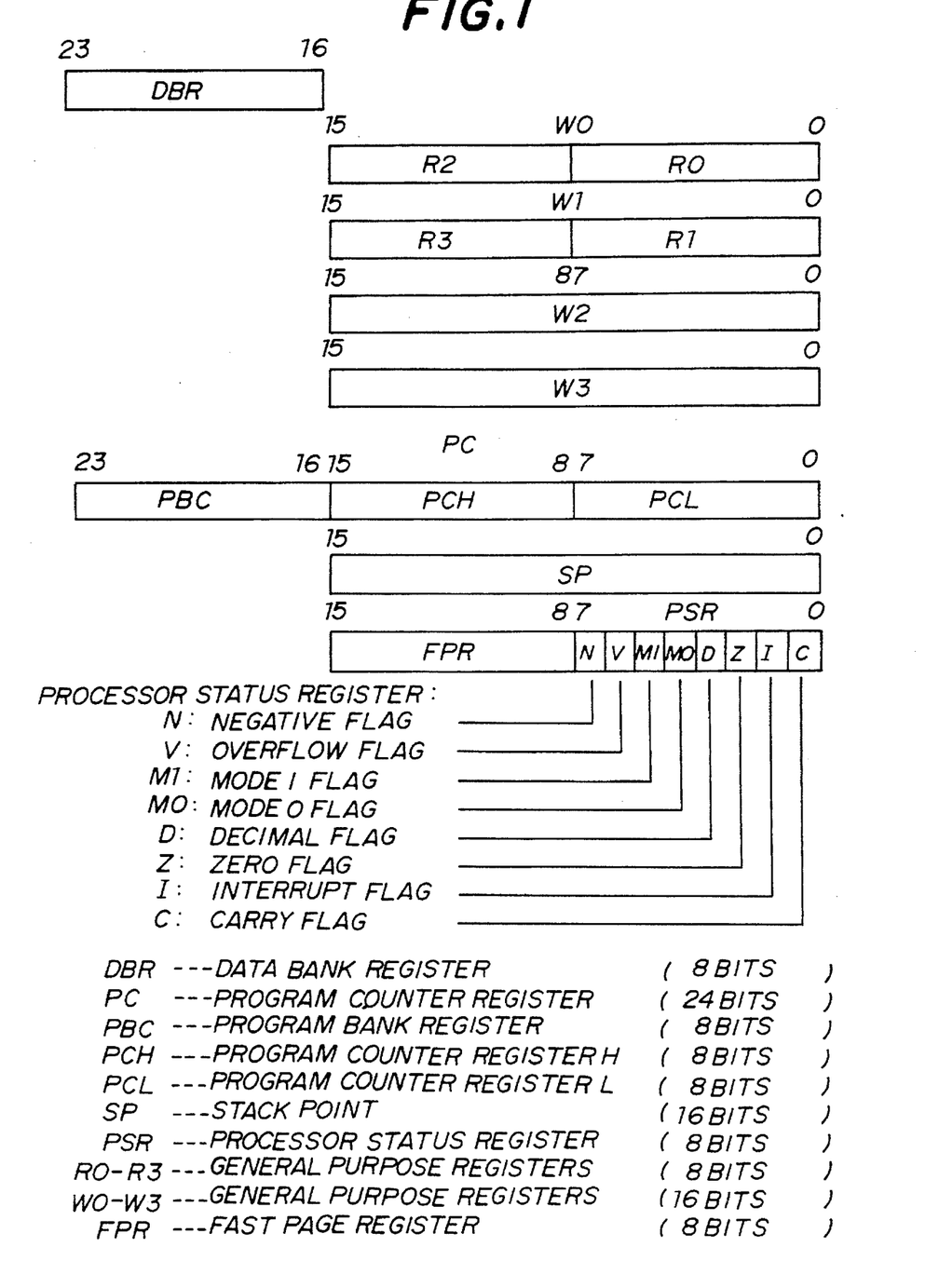
FIG. 1 is a diagram illustrating a programming model.

Referring to FIG. 1, there is illustrated a programming model. A basic word of the CPU according to the present embodiment consists of 8 bits. An address space is specified by a program counter (PC) consisting of 24 bits, which are grouped into 3 program counters PBC, PCH and PCL. It is possible to handle linear addresses amounting to 16 megabytes. PBC is a program bank counter register (hereafter simply referred to as a PBC register), PCH denotes a program counter register (hereafter simply referred to as a PCH register), and PCL denotes a program counter register (hereafter simply referred to as a PCL register).

On the other hand, data access is configured by using a bank method. A bank address is basically registered in an 8-bit data bank register (DBR). 64 Kbyte linear addresses and 256 banks are used, so that a 16 Mbyte access can be realized. The output signal of the data bank register DBR which forms the bank address will be described later together with flags M1 and M0.

There are provided a plurality of general purpose registers W0, W1 and W2, each consisting of 16 bits. Each of the registers W0 and W1 is divided into two 8-bit blocks, as shown in FIG. 1. It will be noted that the four 8-bit blocks are denoted by R0 and R2 related to the register W0, and R1 and R3 related to the register W1. With the above-mentioned arrangement, it becomes possible for the CPU to process both 8-bit data and 16-bit data.

A stack pointer (SP) register consisting of 16 bits is provided for defining a stack space. By using the stack pointer register, it becomes possible to linearly access 64 Kbytes. The bank address is fixed to "00"h.

A processor status register (PSR) indicates the current operating status of the CPU, and flags N, V, Z and C which vary depending on the operation results. Further, the processor status register has flags I, and D. The flag I indicates whether or not an interrupt request is acceptable, and the flag D is related to correction of the result of an addition/subtraction instruction. When D=1, the result of the execution of addition/subtraction is automatically subjected to a denary correction.

The flags M1 and M0 make it possible to select data related to the bank address output when the data space is accessed. Thus, by respectively setting the flags M1 and M0 to arbitrary values (renewed by the CPU), it becomes possible to select either the band address in the data bank register DBR or a constant, such as "00"h. This arrangement makes various applications possible.

A fast page register (FPR) functions as an address pointer at the time of accessing data, and is used in an addressing mode called a fast direct addressing mode. It will be noted that "addressing" means a procedure for specifying the address of a storage area in which desired data is stored. In the fast direct addressing mode, only 8-bit data is fetched, and the fetched 8-bit data is set to a low-order part (bits 7-0) of the effective address, and the content of the fast page register FPR is set to a high-order part (bits 15-8). The fast page register FPR becomes effective in the above addressing mode. The bank address output in the fast direct addressing mode is dependent on the status of the flags M1 and M0. In the fast direct addressing mode, only one byte of the operand data is fetched, and thus, it is possible to access data within an identical page (in which bits 15-8 are constant) at a higher speed.

Figure 2A:
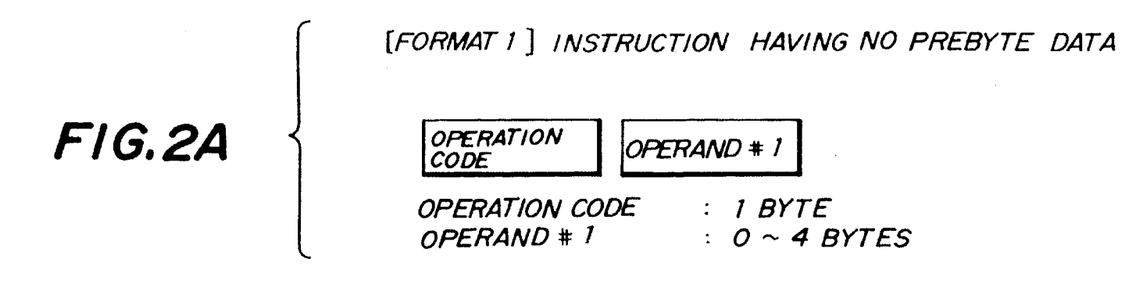
FIGS. 2A, 2B and 2C are diagrams illustrating formats of instructions used in a CPU according to a preferred embodiment of the present invention.
Figure 2B:
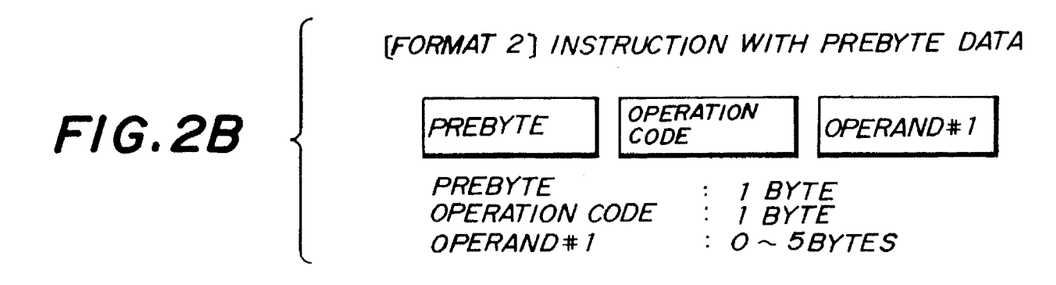
Figure 2C:
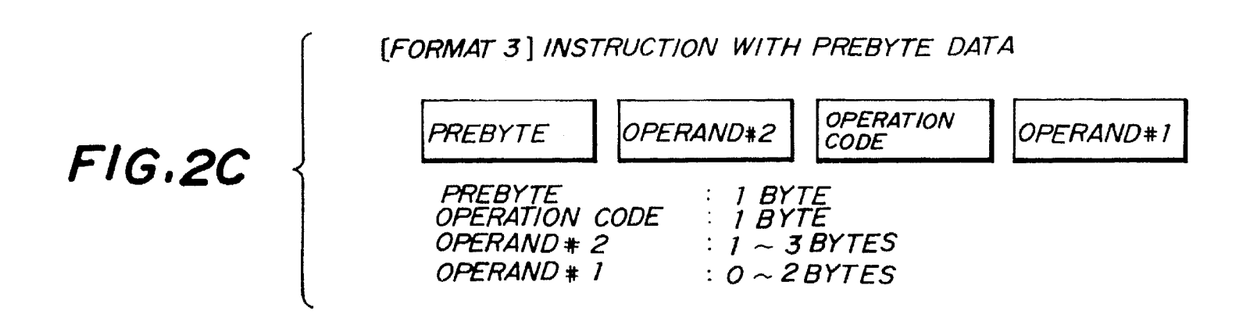

FIGS. 2A, 2B and 2C show the formats of instructions of the CPU according to the embodiment of the present invention. The basic word length processed in the CPU consists of 8 bits, as has been described previously. One-byte data for use in instruction extension, called a prebyte data, is arranged so that it precedes the operation code. The CPU fetches the prebyte data at first. Basically, the prebyte data contains information about the addressing mode, and the operation code has the content of an instruction which should be executed. An instruction which will be frequently used has a special format shown in FIG. 2A. The instruction shown in FIG. 2A, called an abbreviated instruction, is composed of only an operation code and an operand, and does not have prebyte data. The operation code in FIG. 2A includes information about the addressing mode and the content of the instruction. The instruction in FIG. 2A does not have the prebyte data which reduces the instruction code length and the execution time.

Further, two formats are provided for the operand data shown in FIGS. 2B and 2C. The format shown in FIG. 2B has an operation code subsequent to the prebyte data, and operand data (#1) following the operation code. The format shown in FIG. 2C has second operand data (#2) disposed between the prebyte data and the operation code. The second operand data disposed between the prebyte data and the operation code is used in an addressing mode with displacement (relative address). In the addressing mode with displacement, the effective address is generated by adding, as an offset, data fetched by the operand or the value in a register specified by the operand to the data in the internal register. When the addressing mode with displacement is used, if the format of the operand data shown in FIG. 2B is used, it will take a long time to calculate the effective address because the operand data of the displacement is fetched, and thereafter, the effective address is calculated. Thus, after the displacement data of the operand is fetched, there are a plurality of idle cycles. On the other hand, by using the format shown in FIG. 2C and arranging the displacement data between the prebyte data and the operation code, it becomes possible to calculate the effective address while the operation code is being fetched. Thus, it becomes possible to prevent the occurrence of wasteful idle cycles.

Figure 3:
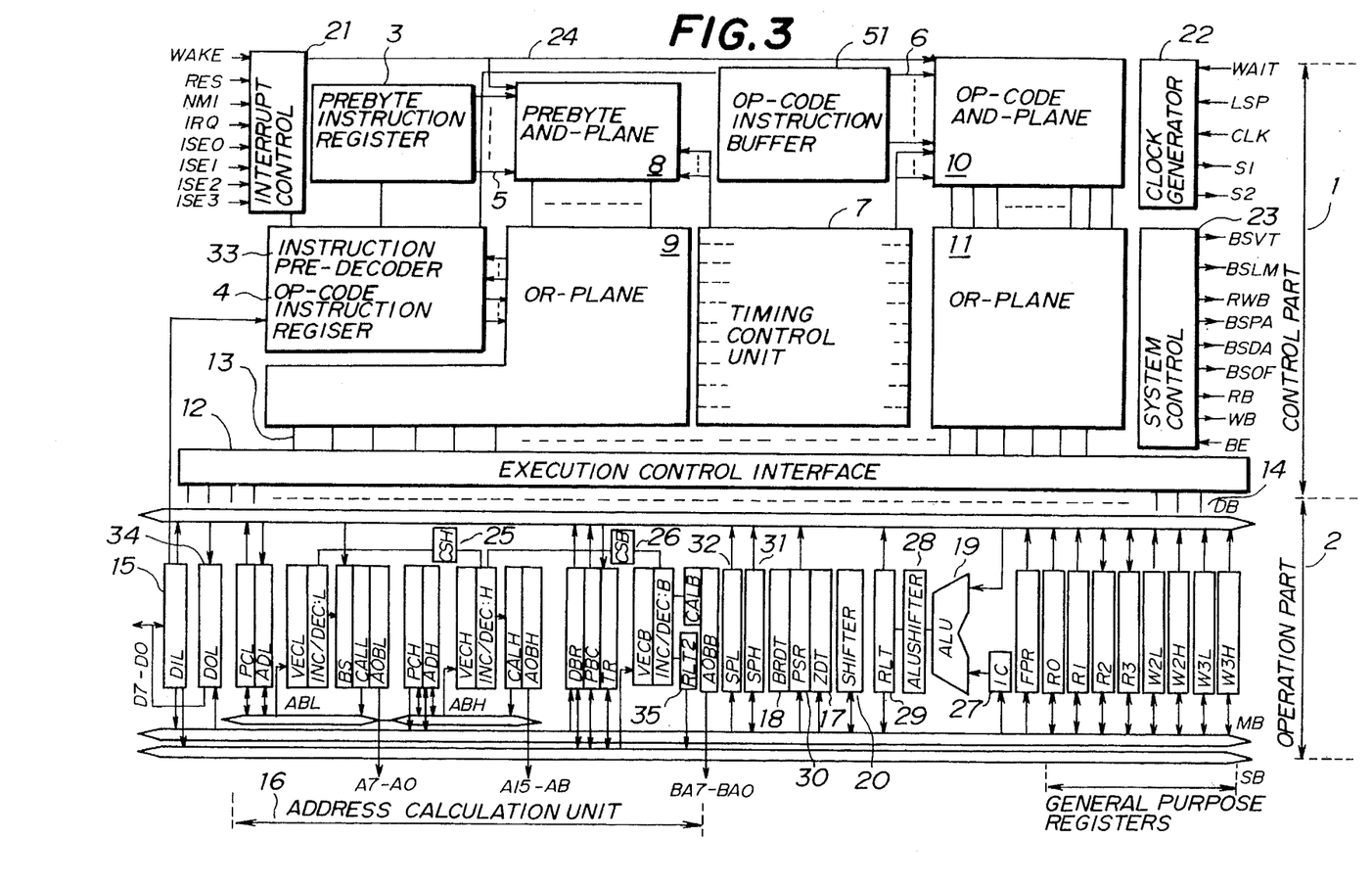
FIG. 3 is a block diagram illustrating the entire structure of the CPU according to the preferred embodiment of the present invention.

FIG. 3, illustrates the structure of the CPU according to the preferred embodiment of the present invention. The structure of the CPU is divided into a control part 1 and an operation part 2.

A description will first be given of the control part 1. The control part 1 controls the execution of instructions. During operation, an instruction code is supplied to a data input latch circuit (DIL) 15 via a data bus carrying data bits D7-D0 from an external device. Then the instruction code is sent to an instruction register in an instruction register 3 related to the prebyte data or an instruction register 4 related to the operation code, and maintained therein until the next instruction is generated.

A plurality of outputs 5 and 6 of the instruction registers 3 and 4 as well as outputs of a timing control unit (TCU) 7 are input to an instruction decoding system (PLA) composed of OR planes 9 and 11 and AND planes 8 and 10. As will be described later, the entire AND plane of the CPU is divided into the AND planes 8 and 10, while the OR planes 9 and 11 substantially form a single OR plane of the CPU.

The result of decoding is input to an execution control interface (ECI) 12, which generates a plurality of control signals 14 from the received recording result and which outputs the control signals 14 to the operation part 2 at an adjusted timing. The AND plane 8 is used for the prebyte data, and the AND plane 10 is used for the operation code. The two OR planes 9 and 11 are provided in common for the prebyte data and the operation code. As has been described previously, the prebyte data has information about the addressing mode, and the operation code includes the content of the operation. In this way, the PLA is functionally grouped into the two parts in order to facilitate the decoding and eliminate redundancy and form a small PLA (particularly, AND planes) which separately handle the prebyte data and the operation code.

It is possible to operate the AND planes 8 and 10 at the same time or operate only one of them in response to an input signal from an interrupt controller 21. A control code of an interrupt sequence is allotted to the AND plane 8 related to the prebyte data. Thus, while an interrupt request is being processed, the AND plane 10 related to the operation code side is not operating.

The operation part 2 carries out an operation and controls a data transfer between the CPU and an external device in accordance with the control signals generated and output by the execution control interface (ECI) 12.

The CPU has internal buses MB, DB and SB, each of which consists of 8 bits. The CPU has a group of registers (which have been described by referring to the programming model), an arithmetic logic unit (hereafter simply referred to an ALU) 19, a shifter 20 and an address control unit (ACU) 16. The ALU 19 calculates various operations, such as data and the effective address. The shifter 20 executes an 8-bit shift operation. The address control unit 16 mainly has a function of generating the address.

The ALU 19 has an incrementer 27 provided on the input side thereof. The incrementer 27 supports the operation executed by the ALU 19, and has the functions of passing through an input signal, inverting the same and generating constant data, such as "00"h. The ALU 19 includes a denary correction circuit which has a so-called D flag function, which will be described later.

The operation part 2 has a zero detector (ZDT) 17 which detects a state where data via the internal bus MB are all zero, and a branch condition detector (BRDT) 18 which determines whether or not a branch condition indicated by a branch instruction is satisfied by referring to the status information (C, Z, N, V) in the processor status register PSR 30. The function of the address calculation unit 16 is realized by a plurality of divided functional portions, each having a unit of 8 bits. A carry can propagate between the divided functional portions. With this arrangement, it is possible to calculate an address having a maximum of 24 bits. It is possible for the address calculation unit 16 to carry out not only the address calculation but also the data calculation.

The address calculation unit 16 has increment/decrement circuits (INC/DEC:L, INC/DEC:H, INC/DEC:B) provided in a unit of 8 bits, and 8-bit internal buses ABL, ABH and SB. Data from the internal buses ABL, ABH and SB are selectively increased or decreased by data "00"h "01"h and "02"h. The results of the calculation of the increment/decrement circuits INC/DEC:L, INC/DEC:H, INC/DEC:B are selectively stored in latch circuits CALL, CALH and CALB, respectively, and read out therefrom and then transferred to address buffers AOBL, AOBH and AOBB, respectively. It will be noted that the term "selectively" means that the results of calculation are not always stored in the corresponding latch circuits. More specifically, the results of calculation are latched when the address calculation is carried out, and may be not latched when the data calculation is carried out. A result register (RLT2) 35 always latches the result of calculation when the increment/decrement circuit INC/DEC:B operates.

The address calculation unit 16 has vector address generators VECL, VECH and VECB which coercively generate an interrupt vector when an interrupt is generated. Further, the address calculation unit 16 has a circuit BS, which outputs data via the bus DB as an address without using the increment/decrement circuits INC/DEC.

In the CPU according to the preferred embodiment of the present invention, the effective address is generated by using both the ALU 19 and the ACU 16, particularly in the addressing mode with displacement or when a branch instruction is processed. A carry selector (CSH) 25 and a carry selector (CSB) 26 are used in such cases. By using the carry selectors 25 and 26, it becomes possible to reflect a carry or borrow by the execution of calculation by the ALU 19 to the calculation of the address calculation unit 16.

The results of the operations latched by the increment/decrement circuits INC/DEC selectively renew data in registers PC, DBR, TR, ADH and ADL via buses BR, TR, ADH and ADL.

The CPU further includes a clock generator 22 which controls clocks of the CPU, and a system controller 23 which generates various signals informing peripheral systems of the operating status of the CPU. An instruction predecoder 33 predecodes an instruction code and judges whether or not it is an abbreviated instruction, or whether or not it has prebyte data which forms an indefinite combination with the operation code contained in the instruction code.

A further description will now be given of the elements of the operation part 2.

[General Purpose Registers]

The general purpose registers output data in the data operation and the data transfer, and store the result of the data operation and data transfer. The general purpose registers are illustrated in FIG. 1 and FIG. 3. The registers W0 and W1 respectively have two 8-bit blocks (R0, R2) and (R1, R3). Thus, it is possible to separately use the two blocks of each of the registers W0 and W1. An information about whether each register W0 and W1 should be used as a single 16-bit register or two 8-bit registers is given by an instruction. Thus, the CPU can handle not only 8-bit data but also 16-bit data.

Registers W2 and W3 are specified and used as pointers in the addressing mode at the time of data accessing. Each of the registers in the general purpose registers is formed of a latch (which does not have a set and reset function), and connected as follows. Basically, the registers latch data input from the internal bus MB and output the latched data to the internal bus DB or the internal bus MB. Only the register R2 is related to the execution of a division instruction, and thus input data from the internal bus DB. More specifically, the relationship between the inputs and outputs of the respective registers is obtained as shown in Table 1.

TABLE 1

| Register | Input | Output |
|---|---|---|
| R0(W0L) | MB | DB or MB |
| R2(W0H) | MB or DB | DB or MB |
| R1(W1L) | MB | DB or MB |
| R3(W1H) | MB or DB | DB or MB |
| W2L | MB | DB or MB |
| W2H | MB | DB or MB |
| W3L | MB | DB or MB |
| W3H | MB | DB or MB |

[Fast Page Register (FPR)]

The fast page register FPR which has been described previously with reference to FIGS. 1 and 3 is used in the aforementioned fast direct addressing mode. The fast page register FPR is formed of a latch (which does not have the set and reset function) and connected to the internal buses in such a way that the fast page register FPR latches data input from the internal bus MB, and outputs the latched data to the internal bus DB.

[Input Controller (IC) 27]

The input controller 27 shown in FIG. 3 controls data which is input to the ALU 19 via the internal bus MB. Table 2 shows the relationship between the data and input.

TABLE 2

| Data | Input |
|---|---|
| MB bus data | ALU |
| Inverted version of MB bus data | ALU |
| Constant "00"h | ALU (MB bus data is neglected) |
| Constant "01"h | ALU (MB bus data is neglected) |
| Constant "02"h | ALU (MB bus data is neglected) |
| Constant "03"h | ALU (MB bus data is neglected) |

[ALU 19]

The ALU 19 shown in FIG. 3 receives 8-bit data from the internal bus DB and 8-bit data from the input controller 27, and executes various operations thereon. The operations executed by the ALU 19 have logic operations AND, OR, EXOR and SUM. By setting the D flag in the processor status register PSR to 1, the ALU 19 carries out a denary correction for addition and subtraction during the same operation cycle. Further, the ALU 19 has the functions of detecting the generation of a carry or borrow and the occurrence of an overflow, and latching the carry/borrow and the overflow. The carry is maintained in the ALU 19 until it executes the next SUM operation. In other words, there is no change in the carry when the AND, OR or EXOR operation is executed.

[ALU shifter 28]

The ALU shifter 28 shown in FIG. 3 is formed of a shift register which executes a one-bit-shift-right procedure for 8-bit data, and mainly used in the multiplication instruction. Data input to the shift register 28 is the result of the SUM (addition) operation executed by the ALU 19. The most significant bit of the input data is the carry bit generated by the sum operation. One-bit data corresponding to the least significant (lowest-order) bit output by the shift operation is finally held as a carry.

[Result register (RLT) 29]

The result register 29 holds the results of the operation by the ALU 19, and is connected to the internal buses in such a way that data in the result register 29 is output to the internal bus DB or MB. The data in the result register 29 is not renewed until the ALU 19 executes a next operation.

[Shifter 20]

The shifter 20 shown in FIG. 3 is formed of a flip-flop, which selectively executes a one-bit-shift-left operation, a one-bit-shift-right operation and no shift operation in accordance with the corresponding control signal from the execution control interface 12. The shifter 20 is connected so that data is input to the shifter 20 from the internal bus MB and output to the internal bus MB.

[Zero detector (ZDT) 17]

The zero detector 17 shown in FIG. 3 monitors the status of the internal bus MB, and generates a signal which indicates when all the bits of the internal bus MB are "00"h. Particularly, the signal generated by the zero detector 17 controls the flag Z provided in the processor status register 30 so that when the result of operation by the ALU 19 is output to the internal bus MB via the result register 29, the result "00"h is detected and the flag Z is set to "1".

[Processor status register (PSR) 30]

The processor status register 30 shown in FIG. 3 receives data from the internal bus MB and outputs the same to the internal bus DB. The data in the processor status register 30 indicates the current operating status of the CPU.

[Branch detection circuit (BRDT) 18]

The branch detection circuit 18 shown in FIG. 3 is connected to the processor status register 30, and generates a signal indicating whether or not a branch operation should be carried out by referring to the contents of the processor status register 30 when a branch instruction is generated.

[Address output buffers (AOBB, AOBH and AOBL)]

The address output buffers AOBB, AOBH and AOBL shown in FIG. 3 respectively handle 8 bits and output an address consisting of 24 bits in total (BA7-BA0, A15-A0). The address output is set to a low-impedance state when a bus enable signal BE input to the system controller 23 is at a low level. [Vector address generators (VECB, VECH, VECL)]

The vector address generators VECB, VECH, VECL shown in FIG. 3 generate a vector address of 24 bits during an interrupt process.

[Address calculation latch circuits (CALB, CALH, CALL)]

The address calculation latch circuits CALB, CALH, CALL provided in the address calculation unit 16 shown in FIG. 3 selectively latch the results of operation output by the increment/decrement circuits INC/DEC:B, INC/DEC:H and INC/DEC:L, respectively, only when the address calculation is carried out.

[Increment/decrement circuits (INC/DEC:B, INC/DEC:H, INC/DEC:L]

The increment/decrement circuits INC/DEC:B, INC/DEC:H and INC/DEC:L shown in FIG. 3 increase or decrease data. Each of the increment/decrement circuits consists of 8 bits, and a carry generated by the operation is propagated to the upper increment/decrement circuit. For example, a carry generated from the increment/decrement circuit INC/DEC:L is propagated to the increment/decrement circuit INC/DEC:H, and a carry generated from the increment/decrement circuit INC/DEC:H is propagated to the increment/decrement circuit INC/DEC:B. In this way, the 24-bit address is generated. Data are input to the increment/decrement circuits INC/DEC:B, INC/DEC:H and INC/DEC:L via the data buses SB, ABH and ABL, respectively.

Each of the increment/decrement circuits INC/DEC:B, INC/DEC:H and INC/DEC:L selectively carry out a data holding operation, an increment/decrement operation on "01"h, and an increment/decrement operation on "02"h.

[Bus selector (BS)]

The bus selector BS has a data select function of directly inputting 8-bit data from an external device outside of the CPU to the address output buffer AOBL via the internal bus DB without passing through the increment/decrement circuit INC/DEC:L. In the aforementioned fast direct addressing mode, it is necessary to output the effective address during a cycle following a cycle during which 8-bit operand data for the effective address is fetched. In this case, if the increment/decrement circuit INC/DEC:L is used, a delay will occur. From this point of view, the data selector BS receives the opened data from the data input register (DIL) 15 via the internal bus DB, and rewrites the content of the address output buffer AOBL by using the data at a high speed.

[Carry selectors (CSH, CSB) 25, 26]

The carry selector (CSH) 25 has a data select function of selecting either a carry from the lower-order side increment/ decrement circuit INC/DEC:L or a carry generated by the ALU 19 when the data calculation is carried out. Similarly, the carry selector (CSB) 26 has a data select function of selecting either a carry from the lower-order side increment/ decrement circuit INC/DEC:H or a carry generated by the ALU 19 when the data calculation is carried out. With this arrangement, the ALU 19 and the address calculation unit 16 cooperate with each other so that it becomes possible to execute an addition (SUM) operation about displacement data in the effective address generating procedure, and the address calculation of a program relative address when the branch instruction is processed.

For example, in an addressing mode in which an effective address is generated by adding 8-bit displacement data to 24-bit data, the ALU 19 adds bits 7-0 of the 24-bit data and the 8-bit displacement data, and the address calculation unit 16 executes an operation on the remaining 16 bits. When the addition result output by the ALU 19 has a carry, it is input to the address output buffer AOBH via the carry selector (CSH) 25. Thus, the address calculation unit 16 executes an operation including the above carry up.

On the other hand, in an increment operation using the program counters PBC, PCH and PCL, the address is generated by using only the address calculation unit 16. That is, the ALU 19 is allowed to execute another operation independent of the address calculation. During this operation, the carry from the ALU 19 is neglected, and the carry generated by the address calculation unit 16 is propagated via the carry selector 25.

[Program counters PBC, PCH, PCL]

The program counters PBC, PCH and PCL are formed of a 24-bit program counter latch circuit. The increment operation on this latch circuit is carried out by using the increment/decrement circuits INC/DEC:B, INC/DEC:H and INC/DEC:L. The program counters PBC, PCH and PCL are connected to the internal buses, as shown in Table 3.

TABLE 3

| Program counter | Input | Output |
| --- | --- | --- |
| PBC | SB | DB or SB |
| PCH | ABH | MB or ABH |
| PCL | ABL | DB or ABL |

[Temporary registers TR, ADH, ADL]

Each of the temporary registers TR, ADH and ADL is formed of an 8-bit register. These temporary registers cannot be operatively seen outside of the CPU. The temporary registers TR, ADH and ADL are connected to the internal buses, as shown in Table 4.

TABLE 4

| Program counter | Input | Output |
| --- | --- | --- |
| TR | DB or SB | SB |
| ADH | MB or ABH | ABH |
| ADL | DB or ABL | ABL |

[Data bank register DBR]

The data bank register DBR shown in FIG. 3 is formed of an 8-bit latch circuit. Basically, the bank address used when data is accessed is the address in the data bank register DBR. However, the address in the data bank register DBR is changed in accordance with the status of the mode flags M1 and M0 in the processor status register PSR. The data bank register (DBR) inputs data from the internal bus MB or SB, and outputs the bank address to the internal bus DB or SB.

[Data input latch circuit (DIL) 15]

The data input latch circuit 15 shown in FIG. 3 is formed of an 8-bit latch circuit. Data output D7-D0 from an external device is input to the data input latch circuit 15, which outputs an instruction code to the control part 1 and which outputs data to the internal buses DB, MB and SB of the operation part 2.

[Data output latch circuit (DOL) 34]

The data output latch circuit 34 is formed of an 8-bit latch circuit. Data which is to be output to an external device is input to the data output latch circuit 34, which receives data from the internal address bus DB or MB and which outputs data D7-D0.

A description will now be given of the functions of the control part 1 of the CPU.

[Instruction predecoder 33]

The instruction predecoder 33 has the following three functional parts. The first function is as follows. When the decoding operation of an instruction in the PLA is not in time in view of operation timing, the instruction predecoder 33 predecodes the instruction and generates the corresponding control signal. More specifically, the first function includes the procedures for detecting a one-cycle instruction, controlling the generation of an external control signal and controlling the timing control unit 7. The second function of the instruction predecoder 33 supports the decoding operation in order to reduce the size of the PLA. More specifically, the second function includes the procedures for detecting the abbreviated instruction and the data size handled by the instruction. The third function is to detect an indefinite instruction and a software interrupt instruction.

[Clock generator 22]

The clock generator 22 shown in FIG. 3 generates internal clocks used in the CPU, and external clocks used in an external device. Examples of the clock signals are a processor stop input signal WAIT, a bus cycle change input signal LSP, a CPU clock input signal CLK and system (synchronization) clock output signals S1 and S2.

[System controller 23]

The system controller 23 generates a plurality of signals indicating the operating status of the CPU. A signal BSVT (vector table address) indicates a state in which a vector address is being output. A signal BSDA (data address) indicates a state in which data is being accessed. A signal BSPA (program address) indicates a state in which a program is being accessed. A signal BSOF (operation code fetch) indicates a state in which an external memory is being locked. Signals RB (read bar) and WB (write bar) indicate a data bus transfer request for data reading and a data bus transfer request for data writing, respectively. A signal RWB indicates whether the current cycle is the data read cycle or the data write cycle.

The interrupt controller 21 operates the following controls of the CPU. An interrupt RES is a reset interrupt input. An interrupt NMI is a non-maskable interrupt input. An interrupt IRQ is an interrupt input. Interrupt select inputs ISE0-3 are interrupt (IRQ) select inputs. An interrupt WAKE is an input for releasing a processor stop instruction.

The timing controller unit (TCU) 7 controls an operation sequence of the instruction execution. The execution control interface (ECI) 12 receives the result of the decoding by the PLA, and generates the timing-aligned control signals 14. The operation code buffer 51 and the prebyte instruction register 3 are used for storing instructions.

Figure 4:
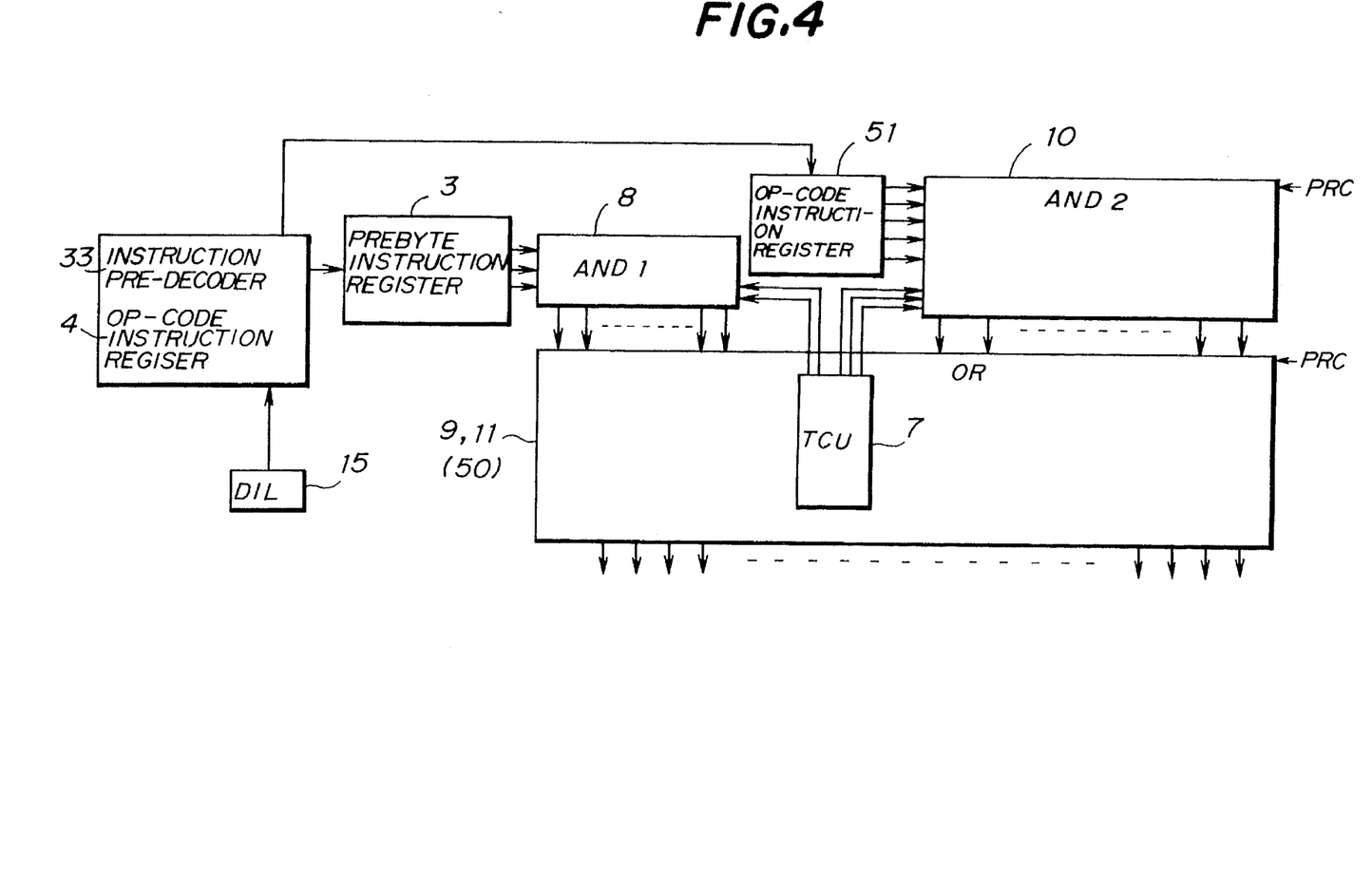
FIG. 4 is a block diagram illustrating a part of the entire structure shown in FIG. 3 which is related to a PLA configuration.

FIG. 4 illustrates the structure of the PLA provided in the above-mentioned CPU. In FIG. 4, those parts which are the same as those shown in FIG. 3 are given the same reference numerals. The output of the data input latch circuit 15 supplied with data from an external device is connected to the instruction predecoder 33 and the operation instruction register 4. The outputs of the instruction predecoder 33 and the operation code instruction register 4 are connected to the prebyte instruction register 3 and the operation code instruction buffer 51.

Figure 5:
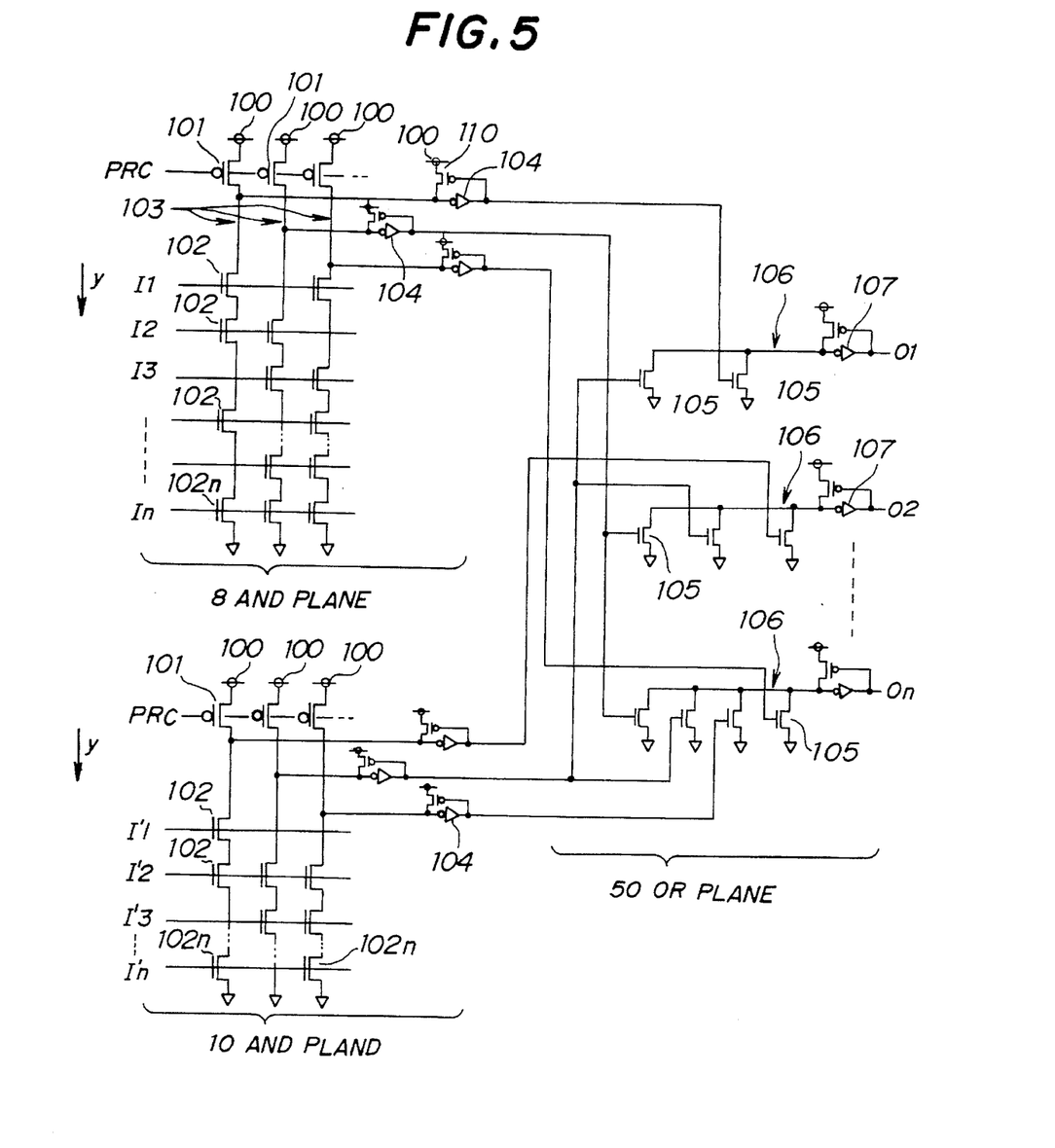
FIG. 5 is a circuit diagram illustrating the structure of two AND planes and a single OR plane shown in FIG. 4.

The entire AND plane is divided into the AND plane 8 and the AND plane 10. The prebyte instruction register 3 related to the addressing mode is connected to the AND plane 8, and the operation code instruction register 51 is connected to the AND plane 10. The output of the timing control unit 7 is connected to the AND planes 8 and 10. The outputs of the AND planes 8 and 10 are connected to the OR planes 9 and 11 integrally formed. Although the OR plane is illustrated in FIG. 3 so that it is divided into the OR planes 9 and 11, the OR planes 9 and 11 are mutually connected to each other. Hereafter, the OR planes 9 and 11 are totally referred to as an OR plane 50. Thus, the two divided AND planes 8 and 10 are connected to the OR plane 50. The AND planes 8 and 10 and the OR plane 50 are configured as shown in FIG. 5.

The AND planes 8 and 10 have P-channel MOS transistors 101 (hereafter referred to as PMOS transistors). The sources of the PMOS transistors 101 are connected to a power supply line 100. The drain of each PMOS transistor 101 is provided for a maximum of n (n is an integer) N-channel MOS (NMOS) transistors 102 which are connected in series so that the source and drain of the adjacent NMOS transistors 102 are connected to each other. The NMOS transistor 102 of the first stage is connected to the drain of the corresponding PMOS transistor 101, and the source of the NMOS transistor 102n is grounded. Output lines 103 respectively extend from the AND planes 8 and 10 in parallel form. One output line 103 extends from the drain of one PMOS transistor 101. The gate of the PMOS transistors 101 provided in each of the AND planes 8 and 10 is connected to a precharge line. When a low-level precharge signal PRC is applied to the PMOS transistors 101, the PMOS transistors 101 are turned ON, so that the output lines 103 are precharged. On the other hand, only when the gates of all the NMOS transistors 102 including 102n connected in series are supplied with high-level signals PRC, the corresponding output line 103 is grounded and set to the low level. Signals I1, I2, . . . , In generated and output by the prebyte instruction register 3 are applied to the gates of the corresponding NMOS transistors 102 102n of the AND plane 8 Similarly, signals I1', I2', . . . , In' generated and output by the operation code instruction buffer 51 are applied to the gates of the corresponding NMOS transistors 102 102n of the AND plane 10.

A circuit composed of a PMOS transistor 110 and an inverter 104 is provided in each of the output lines 103. The drain of each PMOS transistor 110 is connected to the drain of the corresponding PMOS transistor 101, and an input terminal of the inverter 104. The gate of each PMOS transistor 110 is connected to an output terminal of the inverter 104. The source of each PMOS transistor 110 is connected to the power supply line 100. Further, the drain of each PMOS transistor 101 is coupled to the gate or gates of one or more NMOS transistors 105 via the corresponding inverter 104.

The OR plane 50 has a plurality of NMOS transistors 105 which are provided for each of the output lines 103. The drains of the NMOS transistor 105 provided for each of the output lines 103 are grounded, and the sources thereof are connected to n output lines 106 arranged in parallel form. The number of NMOS transistors 105 provided for a respective output line 106 is different from the number for every other outline line 106. Output signals via the output lines 106 pass through inverters 107 and to a following circuit or device. Thus, in the OR plane 50, when any one of the NMOS transistors 105 connected to the output lines 106 is turned ON by the signal supplied from the AND plane 8 or the AND plane 10, the corresponding output line 106 is switched to a low level, which is inverted by the inverter 107 so that a high-level signal is output.

A description will now be given of the operation of the PLA shown in FIG. 5. When the instruction output from the data input latch circuit 15 is in the format having no prebyte data, as shown in FIG. 2A, the instruction passes through the operation code instruction buffer 51, and is input to the AND plane 10. A corresponding control signal is generated from the instruction due to the cooperation of the AND plane 10 and the OR plane 50.

On the other hand, when the instruction output by the data input latch circuit 15 is in the format having the prebyte data, as shown in FIG. 2B or FIG. 2C, this instruction passes through the prebyte instruction register 3, and is supplied to the AND plane 8. Then, a corresponding control signal is generated from the instruction due to the cooperation of the AND plane 8 and the OR plane 50.

It will be noted that the arrangement in which the outputs of the AND planes 8 and 10 are connected in common to the OR plane 50 is employed in order to use not only the address calculation unit 16 but also the ALU 19 as well as the registers when the addressing operation is executed and to use not only the ALU 19 but also data in the registers. For this purpose, the OR plane 50 is used in common for the instructions having prebyte data and instructions having no prebyte data.

It will be noted that the PLA is formed of the two-stage logic circuit and thus the PLA operates at a high speed. Further, since the single timing control unit 7 is used, it is possible to control, as a single continuous sequence, the addressing operation using the AND plane 8 and the instruction operation using the AND plane 10. Further, as compared with the aforementioned logic convolution process, the load of the entire AND plane is not changed greatly, so that the operation speed of the PLA can operate at a stable speed. Further, since the PLA is grounded into two in view of functions, it becomes easy to carry out the logic convolution process and reduce the number of signals input to each AND plane. This means that each of the AND planes 8 and 10 is configured by a reduced number of NMOS transistors 102. Thus, it becomes possible to reduce the size in a direction y shown in FIG. 5. Since the functions of the AND plane are grouped, it becomes possible to use a simple instruction architecture. Particularly, it is possible to easily modify the operation and logic. Further, since the instruction decoders are provided respectively for the addressing and the operation code, it becomes possible to arbitrarily combine the addressing the operation code, so that the substantially orthogonal relationship between the addressing and the operation code can be obtained.

Figures 6, 7, 8:
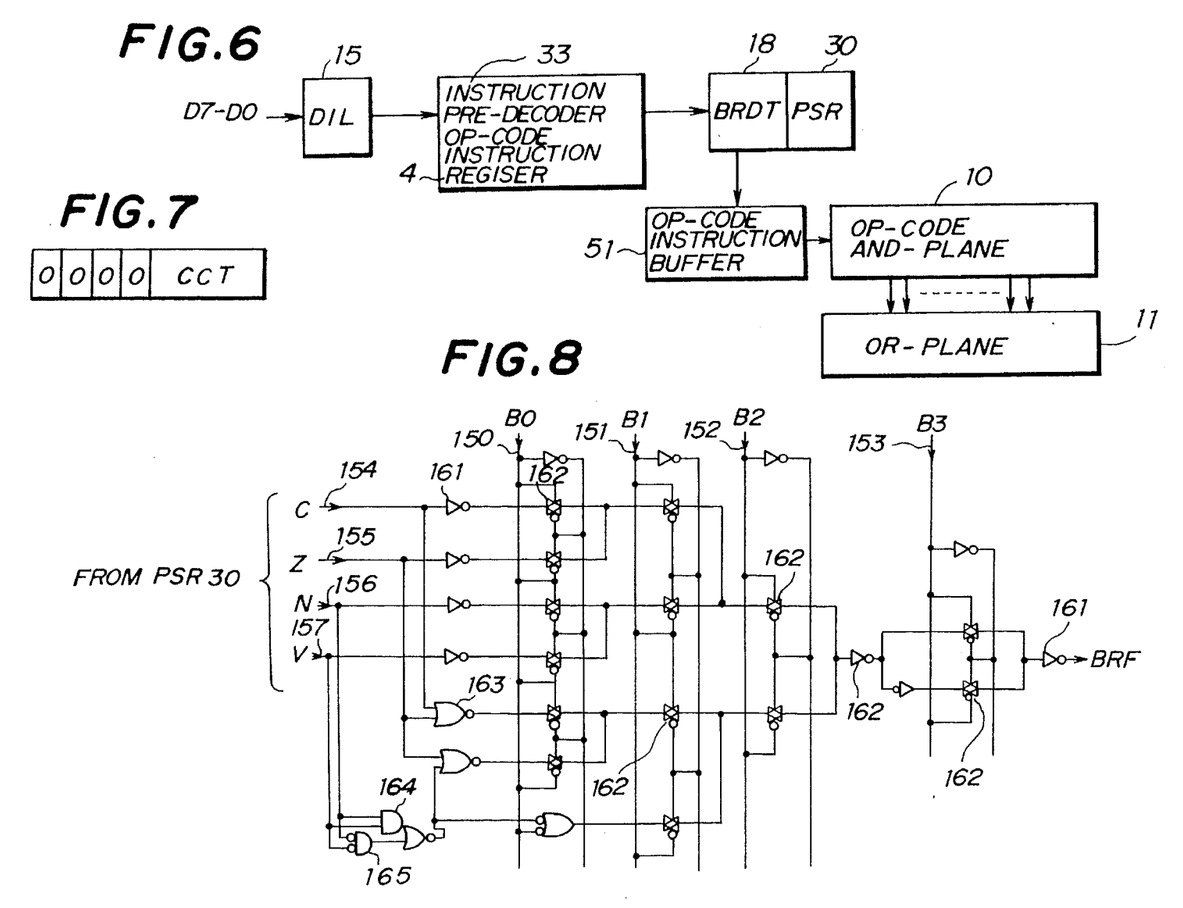
FIG. 6 is a block diagram illustrating a part of the structure shown in FIG. 3 which is related to a branch instruction process.
FIG. 7 is a diagram illustrating a format of a branch instruction.
FIG. 8 is a circuit diagram illustrating a branch detection circuit shown in FIG. 6.

The branch instruction is processed as follows. Referring to FIG. 6, there is illustrated a part of the structure shown in FIG. 3 which processes the branch instruction. In FIG. 6, those parts which are the same as those shown in FIG. 3 are given the same reference numerals. The branch instruction consisting of 8 bits is input to the instruction predecoder 33 via the data input latch circuit 15. The output of the instruction predecoder 33 is connected to the branch detection circuit (BRDT) 18, which generates a signal indicating whether or not the branch process should be carried out by referring to the contents of the processor status register 30 when the branch instruction is generated. The output of the branch detection circuit 18 is coupled to the AND plane 10 via the instruction buffer 51. The output of the AND plane 10 is connected to the OR plane 11, and the PLA related to the branch instruction is configured by the AND plane 10 and the OR plane 11.

The branch instruction is processed as follows. The branch instruction input to the data input latch circuit 15 consists of 8 bits, as shown in FIG. 7. Four high-order bits of the 8-bit branch instruction are all zero, and four low-order bits thereof indicates a branch condition (CCT). The branch instruction is decoded by the instruction predecoder 33, and then supplied to the branch detection circuit 18.

FIG. 8 is a circuit diagram of the branch detection circuit 18. The branch condition formed by the four low-order bits labeled B3-B0 in FIG. 8 is decoded by using the status flag data C, Z, N and V stored in the processor status register 30 in order to determine whether or not the branch process should be carried out. The branch detection circuit 18 outputs a high-level signal when the branch process should be carried out, and outputs a low-level signal when the branch process is not needed.

The bits B3-B0 of the branch condition CCT are input to input lines 150–153, respectively. The branch condition (CCT) data (bits B3-B0) defines 16 different conditions shown in Table 4. It will be noted that C is carry flag data, Z is zero flag data, N is negative flag data and V is overflow flag data.

TABLE 5

| Abbr. | CCT | Branch condition |
|---|---|---|
| NOP | 0000 | Refer to NOP instruction (no operation) |
| BLT | 0001 | N · !V + !N · V (less than) |
| BLE | 0010 | Z + N · !V + N · V (low or equal) |
| BLS | 0011 | C + Z (low or same) |
| BVS | 0100 | V (overflow set) |
| BMI | 0101 | N (minus) |
| BEQ | 0110 | Z (equal) |
| BCS | 0111 | C (carry set) |
| BRA | 1000 | (always) |
| BGE | 1001 | N · V + !N · !V (greater or equal) |
| BGT | 1010 | N · V · !Z + !N · !V · !Z (greater than) |
| BHI | 1011 | !C · !Z (high) |
| BVC | 1100 | !V (overflow clear) (to be continued) |
| BPL | 1101 | !N (plus) |
| BNE | 1110 | !Z (not equal) |
| BCC | 1111 | !C (carry clear) |

Note: "!": logic inversion, "+": AND, "–": OR

As shown in FIG. 8, the branch detection circuit 18 is composed of inverters 161, transfer gates 162, NOR gates 163, an AND gate 164, and NAND gates 165. The data about the status C is input to the corresponding transfer gate 162 controlled by the bit B0 via a line 154 and the inverter 161. The data about the status Z is input to the corresponding transfer gate 162 controlled by the bit B0 via a line 155 and the inverter 161. The data about the status N is input to the corresponding transfer gate 162 controlled by the bit B0 via a line 156 and the inverter 161. The data about the status V is input to the corresponding transfer gate 162 controlled by the bit B0 via a line 157 and the inverter 161. The data about C, Z, N and V respectively pass through the transfer gates 162 controlled by the bit B1. The data about C and Z pass through the transfer gate 162 controlled by the bit B2, and the data about N and V pass through the transfer gate 162 controlled by the bit B2. The output signals of these two transfer gates 161 pass through the inverter, and are branched into two paths, which are respectively controlled by the transfer gates 162 controlled by the bit B3. The output signals of these two transfer gates 162 pass through the inverter 161, and is then output as the branch signal BRF.

The branch signal BRF output by the branch detection circuit 18 is input to the AND plane 10 via the instruction register 51. The PLA controls the branch instruction by the branch signal BRF and other input data, such as the operation code.

As described above, by inputting the branch condition data to the AND plane 10, it becomes possible to execute the branch operation in response to the branch instruction. For example, the branch instruction has the following three addressing procedures in order to indicate the address to which the procedure should be branched.

In the first addressing mode related to the branch instruction, 8-bit data is added to the address of an instruction next to the branch instruction. That is, an address is branched into any one of the addresses in the range of −128 to +127. The above first addressing mode is particularly called a relative addressing mode.

In the second addressing mode related to the branch instruction, 16-bit data is added to the address of an instruction next to the branch instruction. The second addressing mode is particularly called a relative long addressing mode.

In the third addressing mode related to the branch instruction, the data stored in the registers W0–W3 are the address to which the procedure should be branched. The third addressing mode is particularly called a register indirect addressing mode.

For example, the operation in the relative addressing mode is as follows. The operation which generates a branch is as follows. First, the operation code is fetched by address A. Second, 8-bit displacement data (DISPL) which corresponds to the address of the branch destination is fetched by address (A+1). Third, the fetched data is added to address (A+2), and the execution of the instruction ends. Fourth, the operation code in the branch destination is fetched by address (A+2+DISPL). On the other hand, the operation which generates no branch is as follows. First, the operation code is fetched by address A. Second, the execution of the instruction ends by address (A+1). A next operation code is fetched by address (A+2).

The operation in the relative long address mode will be described. The operation which generates a branch is as follows. First, the prebyte data is fetched by address A. Second, the operation code is fetched by address (A+1). Third, the 8 low-order bits (DISPL) of the 16-bit displacement data (which corresponds to the address of the branch destination) are fetched by address (A+2). Fourth, the 8 high-order bits (DISPH) of the 16-bit displacement data (which corresponds to the address of the branch destination) are fetched by address (A+3). Fifth, the fetched data are added to the address (A+4), and the execution of the instruction ends. Sixth, the operation code obtained at the branch destination is fetched by address (A+4+DISP).

On the other hand, the operation which generates no branch is as follows. First, the prebyte data is fetched by address A. Second, the operation code is fetched by address (A+1). Third, the fetched data is added to address (A+2), and the instruction ends. Fourth, the next operation is fetched by address (A+4).

The operation in the register indirect addressing mode will be described. The operation which generates a branch is as follows. First, the prebyte data is fetched by address A. Second, the operation code is fetched by address (A+1). Data stored in the register is loaded as the address of the program counter, and the execution of the instruction ends. The operation code obtained at the branch destination is fetched by th address (register value). On the other hand, the operation which generates no branch is as follows. First, the prebyte is fetched by address A. Second, the operation code is fetched by address (A+1). The instruction ends by address (A+2). The address is not incremented. By address (A+2), the next operation code is fetched.

As has been described above, the operations in the different addressing modes are different from each other. It should be noted that conventional CPUs have only one of the above-mentioned three addressing modes. On the other hand, according to the preferred embodiment of the present invention, the signal indicating whether or not the branch should be made is input to the AND plane 10. As a result, it becomes possible to execute a desired operation while selecting one of the three addressing modes.

The output line from the branch detection circuit 18 to the AND plane 10 of the PLA is a one-bit line, since the signal transmitted via the output line indicates whether or not the branch should be made and is thus only one bit of data. In addition, the output signal of the branch detection circuit 18 is supplied to the AND plane 10 via the instruction buffer 51 in the same way as other data. As a result, the PLA configuration can be formed by a simple control program, separately from other circuit portions.

Figure 9:
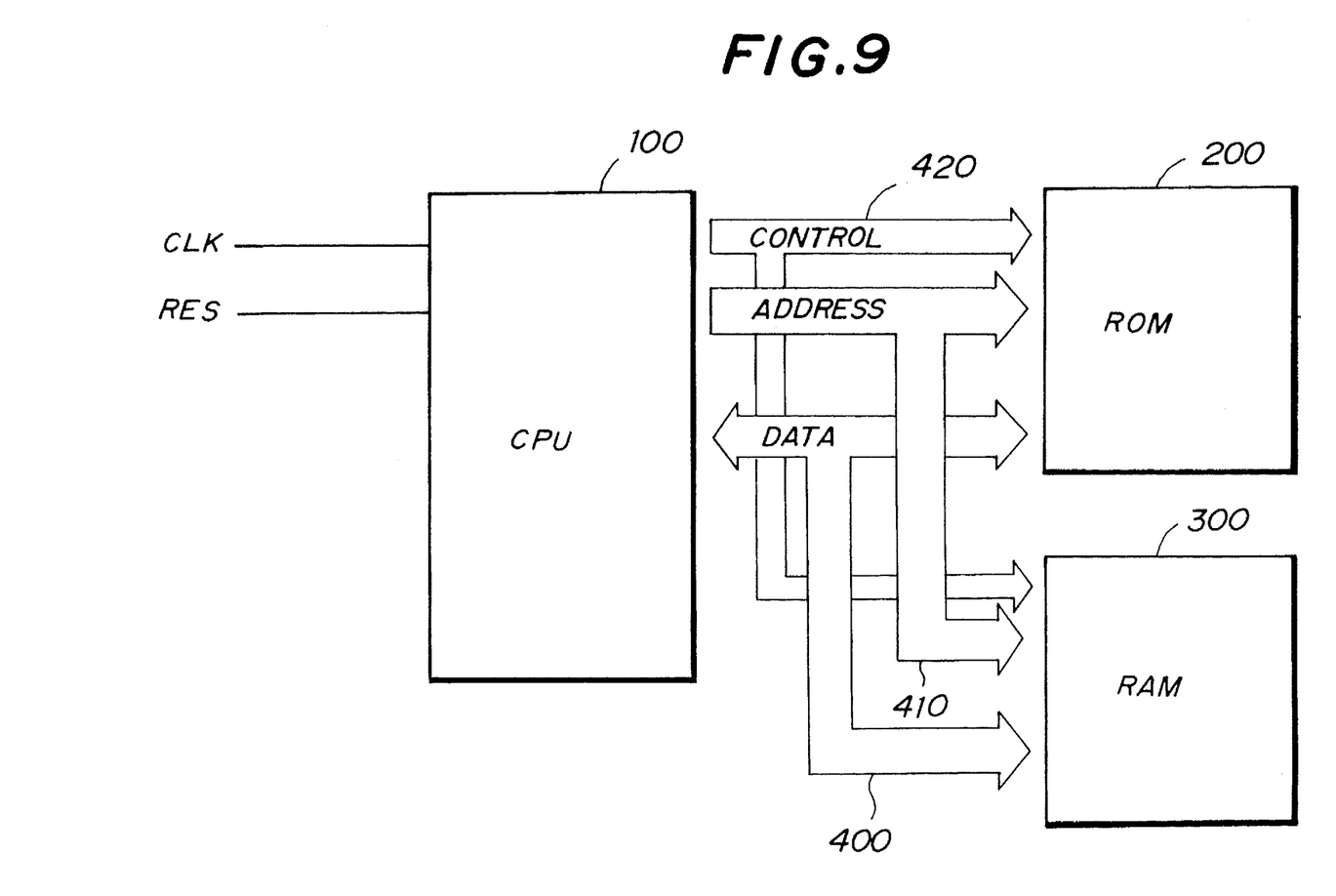
FIG. 9 is a block diagram illustrating a system using the central processing unit according the preferred embodiment of the present invention.

Referring to FIG. 9, there is illustrated a system having a central processing unit according to the aforementioned embodiment of the present invention. The system shown in FIG. 9 is composed of a central processing unit (CPU) 100, a read only memory (ROM) 200 and a random access memory (RAM) 300. These devices are mutually coupled through an address bus 400, a data bus 410 and a control bus 420. A clock signal CLK and a reset signal RES are sent to the CPU 100 from an external device (not shown). The latch circuits 15 and 34 shown in FIG. 13 are coupled to the data bus 410.

The present invention is not limited to the specifically disclosed embodiments of the present invention, and variations and modifications may be made without departing from the scope of the present invention.

What is claimed is:

1. A programmable logic array comprising:

a plurality of AND planes, wherein each of said plurality of AND planes is activated by a respectively different precharge signal functioning as an enable signal to execute an AND logic operation, and has input terminals receiving respectively different code input signals than the other AND planes and output terminals; and a single OR plane, to which the plurality of AND planes are connected, provided in common for said plurality of AND planes and executing an OR logic operation, said single OR plane having input terminals coupled to said output terminals of said plurality of AND planes and output terminals.

2. A programmable logic array as claimed in claim 1, further comprising timing control means, coupled to said plurality of AND planes, for generating a timing signal and causing said plurality of AND planes to receive information in synchronism with said timing signal.

3. A programmable logic array as claimed in claim 1, further comprising information distributing means, coupled to said plurality of AND planes, for receiving information supplied from an external device and for distributing said information to said plurality of AND planes, via said input terminals of the plurality of AND planes, on the basis of a predetermined condition about said information.

4. A programmable logic array as claimed in claim 3, wherein:

said information comprises first information and second information;

said plurality of AND planes has a first AND plane and a second AND plane; and said information distributing means comprises means for distributing said first and second information to said first and second AND planes.

5. A programmable logic array as claimed in claim 1, further comprising predecoder means, coupled to at least one of said plurality of AND planes, for decoding input information and outputting decoded information to said at least one of said plurality of AND planes.

6. A programmable logic array as claimed in claim 5, wherein:

said input information contains prebyte data; and said predecoder means comprises means for decoding said prebyte data and for outputting the decoded prebyte data to said at least one of the plurality of AND planes.

7. A programmable logic array as claimed in claim 6, further comprising register means for temporarily storing said decoded prebyte data supplied from said means for decoding of said predecoder means and for outputting said decoded prebyte data to said at least one of the plurality of AND planes.

8. A programmable logic array as claimed in claim 1, further comprising decoder means for decoding information and for outputting decoded information to said plurality of AND planes, wherein each of said plurality of AND planes comprises:

a plurality of P-channel MOS (metal oxide semiconductor) transistors, each transistor having a gate receiving a control signal from an external device, a first terminal coupled to a first power source, and a second terminal;

a plurality of series circuits, each having a plurality of N-channel MOS transistors connected in series between the second terminal of a corresponding one of the P-channel MOS transistors and a second power source; and AND output lines, each connected to the gate of a corresponding one of the P-channel MOS transistors; wherein said plurality of AND planes are connected to said single OR plane via said AND output lines.

9. A programmable logic array as claimed in claim 8, wherein said single OR plane comprises:

a plurality of OR output lines; and a plurality of groups of N-channel MOS transistors, each of said N-MOS transistors in each of said groups having a gate coupled to a corresponding one of said AND output lines, a first terminal connected to a corresponding one of said OR output lines, and a second terminal connected to said second power source.

10. A programmable logic array as claimed in claim 9, wherein each of said AND output lines is coupled to at least two N-channel MOS transistors of said OR plane.

11. A data processing unit comprising:

a PLA (programmable logic array) circuit which receives information supplied from an external device and outputs a decoded signal;

interface means, coupled to said PLA circuit, for generating a control signal from said decoded signal; and operation means, coupled to said interface means and having an arithmetic logic unit, for carrying out an operation on data on the basis of said control signal, wherein said PLA circuit comprises:

a plurality of AND planes, wherein each of said plurality of AND planes is activated by a respectively different precharge signal functioning as an enable signal to execute an AND logic operation on said information, and has input terminals receiving respectively different code input signals than the other AND planes and output terminals; and a single OR plane to which the plurality of AND planes are connected, provided in common for said plurality of AND planes and executing an OR logic operation on signals output from said AND planes, said single OR plane having input terminals coupled to said output terminals of said plurality of AND planes, and output terminals through which said decoded signal is output.

12. A data processing unit as claimed in claim 11, further comprising timing control means, coupled to said plurality of AND planes, for generating a timing signal and causing said plurality of AND planes to receive said information in synchronism with said timing signal.

13. A data processing unit as claimed in claim 11, wherein said information comprises branch information which indicates a change of a procedure of said operation carried out by said operation means, and wherein said data processing unit further comprises:

predecoder means for decoding said information before said information is input to said plurality of AND planes and for outputting decoded information;

status information means for storing status information which indicates an operation status of said operation means; and branch condition detecting means, coupled to said predecoder means and said status information storing means, for determining whether or not a predetermined branch condition is satisfied on the basis of said decoded information and said operating status of said operation means indicated by said status information stored in said status information storing means and for outputting a detection result to at least one of said plurality of AND planes.

14. A data processing unit as claimed in claim 11, wherein said PLA circuit further comprises information distributing means, coupled to said plurality of AND planes, for receiving said information supplied form said external device and for distributing said information to said plurality of AND planes, via said input terminals of the plurality of AND planes, on the basis of a predetermined condition about said information.

15. A data processing unit as claimed in claim 14, wherein:

said information comprises first information related to an address of a storage area of a storage device coupled to said data processing unit and second information related to carrying out said operation on data; and said information distributing means comprises means for distributing said first and second information to respective first and second AND planes.

16. A data processing unit as claimed in claim 11, further comprising decoder means for decoding said information and for outputting decoded information to said plurality of AND planes, wherein each of said plurality of AND planes comprises:

a plurality of P-channel MOS (metal oxide semiconductor) transistors, each transistor having a gate receiving a control signal from said external device, a first terminal coupled to a first power source, and a second terminal;

a plurality of series circuits, each having a plurality of N-channel MOS transistors connected in series between the second terminal of a corresponding one of the P-channel MOS transistors and ground; and AND output lines, each connected to the second terminal of a corresponding one of the P-channel MOS transistors; and wherein said plurality of AND planes are being connected to said single OR plane via said AND output lines.

17. A data processing unit as claimed in claim 16, wherein said single OR plane comprises:

a plurality of OR output lines; and a plurality of groups of N-channel MOS transisitors, each of said N-MOS transistors in each of said groups having a gate coupled to a corresponding one of said AND output lines, a first terminal connected to a corresponding one of said OR output lines, and a second terminal connected to ground.

18. A data processing unit as claimed in claim 11, further comprising predecoder means, coupled to at least one of said plurality of AND planes, for decoding said information and for outputting decoded information to said at least one of the plurality of AND planes.

19. A data processing unit as claimed in claim 18, wherein:

said information contains prebyte data; and said predecoder means comprises means for predecoding said prebyte data and for outputting the predecoded prebyte data to said at least one of the plurality of AND planes.

20. A data processing unit as claimed in claim 19, further comprising register means for temporarily storing said decoded prebyte data supplied from said means of said predecoder means and for outputting said decoded prebyte data to said at least one of the plurality of AND planes.

21. A data processing unit comprising:

a PLA (programmable logic array) circuit which receives information supplied from an external device and outputs a decoded signal;

interface means, coupled to said PLA circuit, for generating a control signal from said decoded signal; and operation means, coupled to said interface means and having an arithmetic logic unit, for carrying out an operation on data on the basis of said control signal;

wherein said information is in one of at least three different formats corresponding to at least three different addressing modes; and wherein said PLA circuit comprises predecoded means for determining the format of said information and operating in a corresponding one of at least three different addressing modes, and a plurality of AND planes connected to a single OR plane, each of said plurality of AND planes receiving respectively different code input signals and being activated by a respectively different precharge signal functioning as an enable signal.

22. A data processing unit comprising:

a PLA (programmable logic array) circuit which receives information supplied from an external device and outputs a decoded signal;

interface means, coupled to said PLA circuit, for generating a control signal from said decoded signal; and operation means, coupled to said interface means and having an arithmetic logic unit, for carrying out an operation on data on the basis of said control signal;

wherein said information is in one of at least three different formats corresponding to at least three different addressing modes, wherein said PLA circuit comprises predecoded means for determining the format of said information and operating in a corresponding one of at least three different addressing modes, and a plurality of AND planes, each of said plurality of AND planes receiving respectively different input signals; and wherein each of the plurality of AND planes is synchronized with a corresponding clock signal which is controlled independently of the other clock signals.

23. A programmable logic array comprising:

a plurality of AND planes, each executing an AND operation and having input terminals receiving different input signals than the other AND planes and output terminals: and a single OR plane provided in common for said plurality of AND planes and executing an OR logic operation, said single OR plane having input terminals coupled to said output terminals of said plurality of AND planes and output terminals, wherein each of the plurality of AND planes is synchronized with a corresponding clock signal which is controlled independently of the other clock signals.

24. A data processing unit comprising:

a PLA (programmable logic array) circuit which receives information supplied from an external device and outputs a decoded signal;

interface means, coupled to said PLA circuit, for generating a control signal from said decoded signal; and operation means, coupled to said interface means and having an arithmetic logic unit, for carrying out an operation on data on the basis of said control signal, wherein said PLA circuit comprises:

a plurality of AND planes, each executing an AND logic operation on said information and having input terminals receiving different input signals than the other AND planes and output terminals; and a single OR plane provided in common for said plurality of AND planes and executing an OR logic operation on signals output from said AND planes, said single OR plane having input terminals coupled to said output terminals of said plurality of AND planes, and output terminals through which said decoded signal is output, and wherein each of the plurality of AND planes is synchronized with a corresponding clock signal which is controlled independently of the other clock signals.

* * * * *